United States Patent
Katoh (10) Patent No.: US 9,306,554 B2
(45) Date of Patent: Apr. 5, 2016

(54) SEMICONDUCTOR CIRCUIT AND SEMICONDUCTOR APPARATUS

(71) Applicant: LAPIS SEMICONDUCTOR CO., LTD., Yokohama (JP)

(72) Inventor: Teruo Katoh, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 281 days.

(21) Appl. No.: 13/864,328

(22) Filed: Apr. 17, 2013

(65) Prior Publication Data

US 2013/0278166 A1   Oct. 24, 2013

(30) Foreign Application Priority Data

Apr. 20, 2012   (JP) ................. 2012-096552

(51) Int. Cl.
| | | |
|---|---|---|
| H05B 37/02 | (2006.01) | |
| H05B 39/04 | (2006.01) | |
| H05B 41/36 | (2006.01) | |
| H03K 17/00 | (2006.01) | |
| H03K 17/06 | (2006.01) | |
| H05B 33/08 | (2006.01) | |
| H03K 17/14 | (2006.01) | |

(52) U.S. Cl.
CPC .............. *H03K 17/00* (2013.01); *H03K 17/063* (2013.01); *H03K 17/145* (2013.01); *H05B 33/0818* (2013.01); *H05B 33/0824* (2013.01)

(58) Field of Classification Search
CPC ........... H05B 33/0815; H05B 33/0851; H05B 33/0827; H05B 33/0845; H05B 33/0803; H05B 33/0806; H05B 33/0812; H05B 33/0848; H05B 33/0884; H05B 33/0818; H03K 17/00; H03K 17/168; H03K 17/063
USPC ........... 315/186, 307, 224, 122; 327/108–112
See application file for complete search history.

(56) References Cited

U.S. PATENT DOCUMENTS

| | | | |
|---|---|---|---|
| 8,330,504 B2 * | 12/2012 | Olson ........................... | 327/108 |
| 2013/0147360 A1 * | 6/2013 | Kang ........................... | 315/122 |

FOREIGN PATENT DOCUMENTS

| | | |
|---|---|---|
| JP | 2009-135138 | 6/2009 |
| JP | 2010-135379 | 6/2010 |

* cited by examiner

*Primary Examiner* — Diana J Cheng (74) *Attorney, Agent, or Firm* — Volentine & Whitt, PLLC (57) ABSTRACT

A semiconductor circuit includes an operational amplifier, a voltage drop circuit, and a switch. The operational amplifier has an output terminal connected to an active element that produces a load drive current. A reference voltage is input to the non-inverting input of the operational amplifier. The voltage drop circuit drops a voltage outputted from the operational amplifier. The switch applies a voltage corresponding to a predetermined current flowing when the active element is on to the inverting input of the operational amplifier in a first interval in which the active element is on in response to a predetermined voltage from the operational amplifier. The switch allows the voltage dropped by the voltage drop circuit to be input to the inverting input in a second interval in which the active element is off, thereby shortening a time period until the load drive current starts to flow.

8 Claims, 11 Drawing Sheets

SEMICONDUCTOR CIRCUIT AND SEMICONDUCTOR APPARATUS

BACKGROUND

1. Technical Field

The present invention relates to a semiconductor circuit and a semiconductor apparatus used for supplying a predetermined current to a load.

2. Description of Related Art

In recent years, there are increased demands for low power consumption of a liquid crystal display, and thus an LED (Light Emitting Diode) has been used in a backlight instead of a CCFL (Cold Cathode Fluorescent Lamp). Moreover, in order to suppress average power consumption, so-called PWM (Pulse Width Modulation) control has been extensively applied to change a duty ratio of on time to off time by turning on and off a current flowing through the LED in response to the brightness of a picture to be displayed or the environment lightness, and to adjust the luminance of the backlight. In the PWM control, it is necessary to provide a constant current circuit with good controllability.

Figure 1:
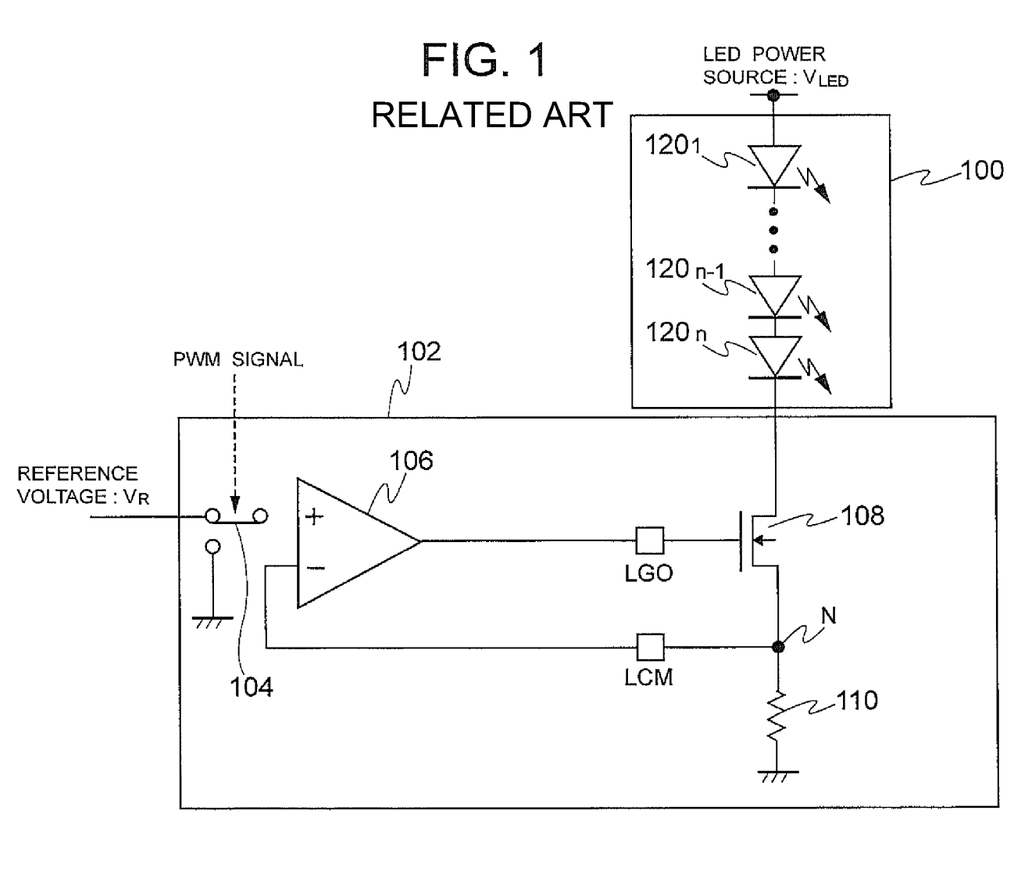
FIG. 1 is a diagram illustrating an example of a conventional generally used constant current circuit that supplies a predetermined current to an LED array.

FIG. 1 illustrates an example of a conventional generally used constant current circuit 102 that supplies a predetermined current to an LED array 100.

The LED array 100 includes a plurality of LEDs $120_1$ to $120_n$ serially connected to one another. The constant current circuit 102 includes a switch 104, an operational amplifier (OP AMP) 106, an N channel MOSFET (Metal Oxide Semiconductor Field Effect Transistor) 108, and a resistor 110.

The LED array 100, the MOSFET 108, and the resistor 110 are serially connected to one another. Specifically, one end, on a cathode terminal side, of the LED array 100 is connected to the drain terminal of the MOSFET 108, and the other end, on an anode terminal side, of the LED array 100 is connected to a power source $V_{LED}$. The source terminal of the MOSFET 108 is connected to one end of the resistor 110, and the other end of the resistor 110 is connected to the ground.

The non-inverting input terminal of the operational amplifier 106 is connected to the switch 104. The switch 104 is switched to one of a first state of supplying a reference voltage $V_R$ to the non-inverting input terminal of the operational amplifier 106, and a second state of connecting the non-inverting input terminal of the operational amplifier 106 to the ground, in response to a PWM signal input from outside.

The inverting input terminal of the operational amplifier 106 is connected to a node N between the source terminal of the MOSFET 108 and the resistor 110, and the output terminal of the operational amplifier 106 is connected to the gate terminal of the MOSFET 108. In addition, the circuit includes a connection terminal LGO for connecting the output terminal of the operational amplifier 106 to the gate terminal of the MOSFET 108, and a connection terminal LCM for connecting the inverting input terminal of the operational amplifier 106 to the node N.

In the constant current circuit 102, the MOSFET 108 is turned on, so that a predetermined current (a driving current $I_{LED}$) flows through the LEDs $120_1$ to $120_n$, which are connected to the drain terminal of the MOSFET 108, and the resistor 110 connected to the source terminal thereof, thereby turning on the LEDs $120_1$ to $120_n$.

FIG. 2A to FIG. 2E illustrate an example of voltage and current waveforms of each terminal of the constant current circuit 102 shown in FIG. 1. Hereinafter, the following conditions are assumed.

Reference voltage $V_R$: 0.4 V
Driving current $I_{LED}$ when LEDs $120_1$ to $120_n$ are turned on (driven): 20 mA
Gate-source voltage when MOSFET 108 is turned on to allow a driving current $I_{LED}$ to flow through LED array 100 and resistor 110: 2.1 V
Resistance value of resistor 110: 2Ω

Figure 2A:
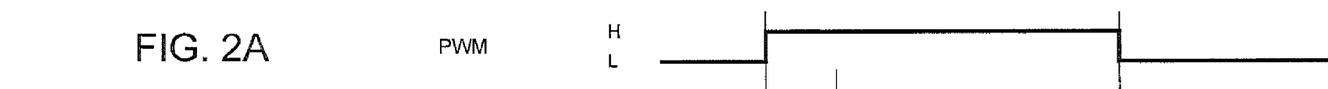
FIGS. 2A to 2E are diagrams illustrating examples of voltage and current waveforms of each terminal of the constant current circuit illustrated in FIG. 1.
Figures 2B, 2C:
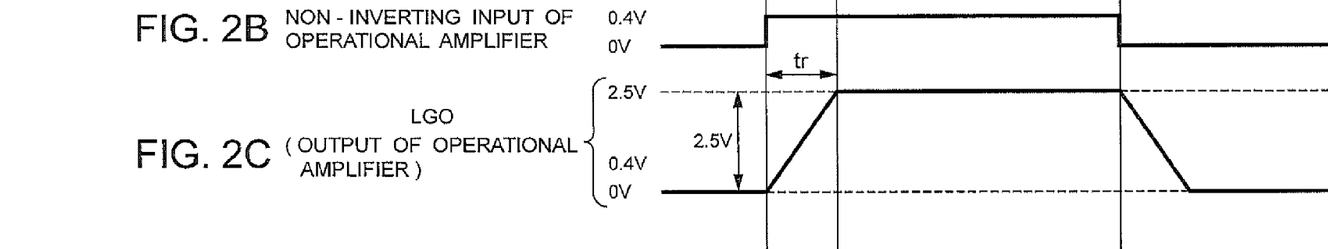
Figure 2D:
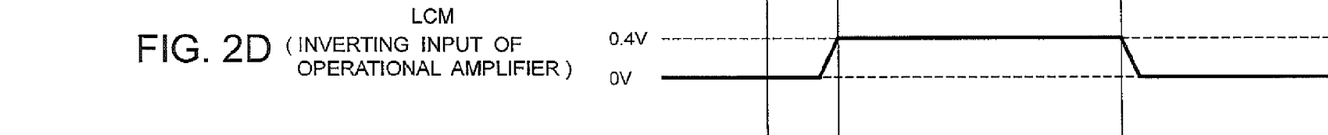
Figure 2E:
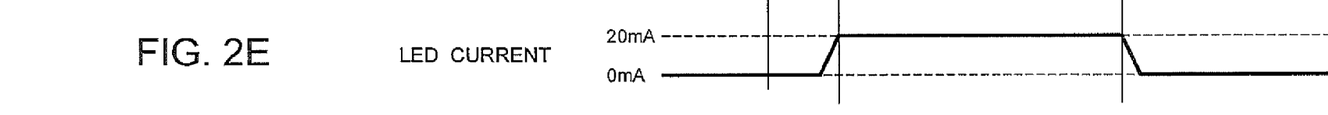

In an interval in which the PWM signal is low (L) (refer to FIG. 2A), the switch 104 enters the second state and the non-inverting input terminal of the operational amplifier 106 is connected to the ground 0V (refer to FIG. 2B). Furthermore, the inverting input terminal of the operational amplifier 106 is connected to the node N. Consequently, an input voltage of the inverting input terminal of the operational amplifier 106 and an output voltage (refer to a voltage waveform of the LGO of FIG. 2C) $V_O$ of the operational amplifier 106 are approximately 0 V (refer to FIG. 2C and FIG. 2D). Since the MOSFET 108 is turned off and the current flowing through the LED array 100 and the resistor 110 is approximately 0 mA (refer to FIG. 2E), each of the LEDs $120_1$ to $120_n$ of the LED array 100 is turned off.

In an interval in which the PWM signal is high (H) (refer to FIG. 2A), the switch 104 enters the first state and the reference voltage $V_R$ (0.4 V) is supplied to the non-inverting input terminal of the operational amplifier 106 (refer to FIG. 2B). The operational amplifier 106 increases the output voltage $V_O$ to 2.5 V such that the voltage of the inverting input terminal is 0.4 V (refer to FIG. 2C). A voltage for turning on the MOSFET 108 is applied to the gate terminal from the output terminal of the operational amplifier 106, so that a current of 20 mA flows through the LED array 100 and the resistor 110 (refer to FIG. 2E), a voltage input to the inverting input terminal is 0.4 V (refer to FIG. 2D), and the LEDs $120_1$ to $120_n$ are turned on.

In addition, as a technology related to the constant current circuit, there has been known an LED driving device including a constant current driving circuit provided with a driving transistor, a plurality of current control transistors, a current control circuit, and a driving transistor control circuit (for example, refer to Japanese Patent Application Laid-Open No. 2010-135379). The driving transistor has a drain terminal connected to a cathode terminal side end of an LED array. Each of the current control transistors has a gate terminal for receiving one of a plurality of first current control signals, a source terminal for receiving a ground voltage, and a drain terminal connected to a source terminal of the driving transistor. The current control circuit switches the plurality of first current control signals, switches the number of current control transistors in an on state, and controls the amount of a current flowing through the LED array. The driving transistor control circuit uses a voltage of the drain terminal of the current control transistor as a feedback signal, amplifies a difference voltage between a voltage value of the feedback signal and a reference voltage such that a change in the voltage value of the feedback signal is suppressed, and outputs the amplified voltage as a gate voltage of a gate terminal of the driving transistor, thereby controlling a current driving ability of the driving transistor to be changed in response to a current amount controlled by the current control circuit.

Furthermore, there has also been known an LED driving circuit including an oscillator, an up/down counter, a digital-to-analog converter, and a transistor (for example, refer to Japanese Patent Application Laid-Open No. 2009-135138). The oscillator generates a clock with a desired frequency. The up/down counter receives the clock from the oscillator, performs a count-up operation in response to the clock when turning on an LED driving current, and performs a countdown operation in response to the clock when turning off the LED driving current. The digital-to-analog converter converts a digital count value output from the up/down counter into an analog signal. The transistor is serially connected to an LED with respect to a direct current power source, and operates in response to an output signal of the digital-to-analog converter.

SUMMARY OF THE INVENTION

However, in the conventional constant current circuit, a variation ($\Delta V_O/\Delta t$) of the output voltage $V_O$ of the constant current circuit with respect to time is limited according to the characteristics of the operational amplifier 106, resulting in an increase in a time period tr (refer to the voltage waveform of FIG. 2C) until the operational amplifier 106 enters a steady state after the PWM signal is switched from L to H. For example, when $\Delta V_O/\Delta t$ is 1 V/μs, a long time of 2.5 μs is necessary for a change in the output voltage from 0 V to 2.5 V.

Specifically, the PWM control used in the control of the constant current circuit is technique for changing a ratio (a duty ratio) of on time to off time. However, the interval expressed by the tr is an obscure interval in which it is not possible to recognize distinction between ON and OFF, and as the time period tr becomes long, a control error is large. In this regard, it is necessary to shorten the time period tr if possible. However, Japanese Patent Application Laid-Open No. 2010-135379 and Japanese Patent Application Laid-Open No. 2009-135138, do not contain any description of measures to solve this problem.

In order to solve the above-described problems, the present invention provides a semiconductor circuit and a semiconductor apparatus, by which it is possible to reduce a time period until a predetermined current starts to flow through a load after the start of switching when an active element connected to the load is switched from OFF to ON and allows the predetermined current to flow through the load, as compared with the related art.

A semiconductor circuit, in which a first load is electrically connected to an active element that is turned on in response to a predetermined input voltage and allows a predetermined current for driving the first load to flow, and the predetermined voltage is input to the active element to control driving of the first load, includes: an operational amplifier that has a first input terminal for receiving a reference voltage, a second input terminal, and an output terminal, and outputs a first voltage from the output terminal such that a voltage input to the second input terminal approximates to the reference voltage input to the first input terminal; a voltage drop circuit which drops the first voltage, which is output from the output terminal of the operational amplifier, and generates a second voltage; and an input switching part which allows a third voltage corresponding to the predetermined current flowing when the active element is turned on to be input to the second input terminal of the operational amplifier in a first interval in which the active element is turned on by the first voltage output from the output terminal of the operational amplifier, and allows the second voltage to be input to the second input terminal in a second interval in which the active element is turned off.

A semiconductor device includes: an active element electrically connected to a first load, turned on in response to a predetermined input voltage, and allowing a predetermined current for driving the first load to flow; a second load electrically connected to the active element and generating a first voltage when the predetermined current flows through the second load; an operational amplifier that has a first input terminal for receiving a reference voltage, a second input terminal, and an output terminal, and outputs a second voltage from the output terminal such that a voltage input to the second input terminal approximates to the reference voltage input to the first input terminal; a voltage drop circuit which drops the second voltage, which is output from the output terminal of the operational amplifier, and generates a third voltage; and an input switching part which allows the first voltage to be input to the second input terminal of the operational amplifier in a first interval in which the active element is turned on by the second voltage output from the output terminal of the operational amplifier, and allows the third voltage to be input to the second input terminal in a second interval in which the active element is turned off.

The configurations described above provide an effect in which, when an active element connected to a load is switched from OFF to ON and allows a predetermined current to flow through the load, a time period until the predetermined current starts to flow through the load after the start of the switching is reduced, as compared with the related art.

DETAILED DESCRIPTION OF THE EMBODIMENTS

[First Embodiment]

Figure 3:
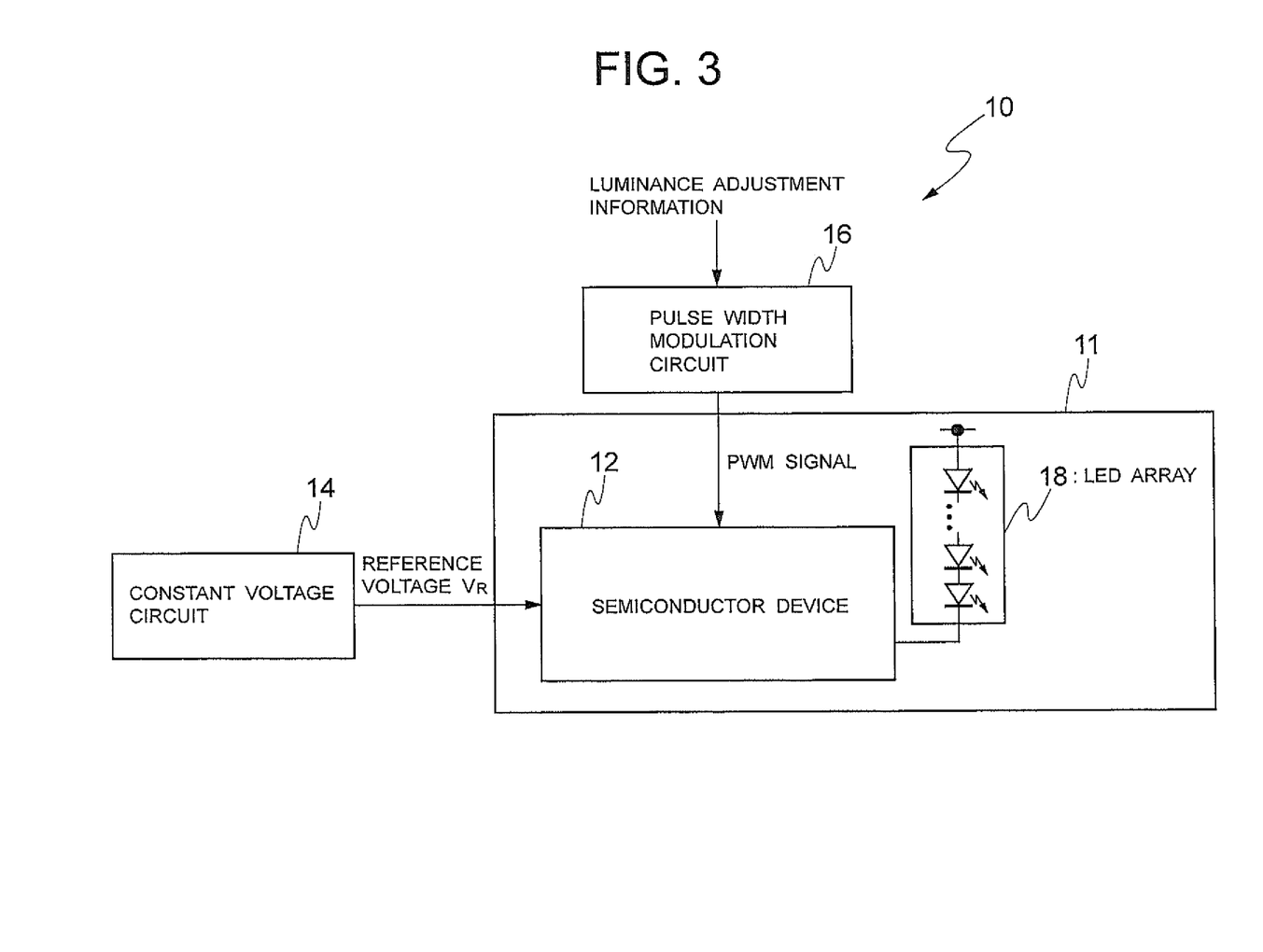
FIG. 3 is a diagram illustrating an example of configuration of an LED driving system according to a first embodiment.

FIG. 3 illustrates an LED driving system 10 according to the first embodiment. In the present embodiment, a description will be provided for an example of the LED driving system 10 that drives an LED used as a backlight of a liquid crystal display through PWM control. However, the purpose of the LED driving system 10 is not limited to the above example so long as it is a system that drives a load such as an LED by a predetermined current.

The LED driving system 10 includes an LED driving apparatus 11 having a semiconductor device 12 and an LED array 18, a constant voltage circuit 14, and a pulse width modulation circuit 16.

Figure 4:
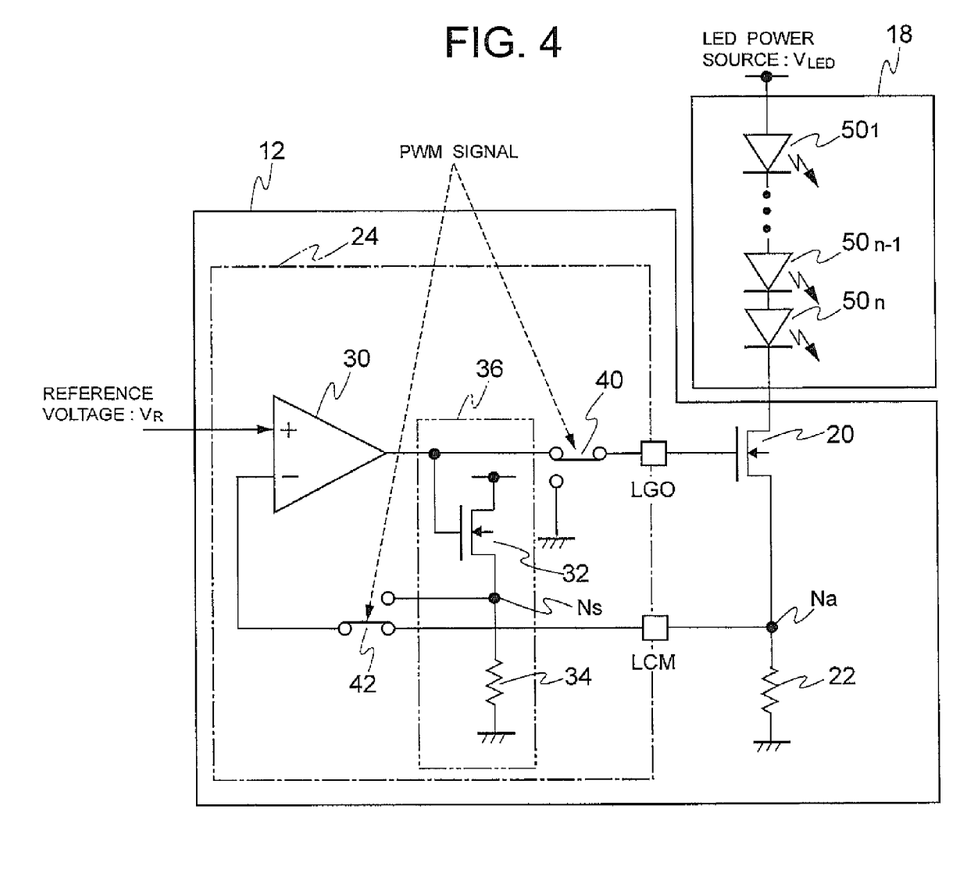
FIG. 4 is a diagram illustrating an LED driving apparatus according to the first embodiment, which illustrates a state of the LED driving apparatus when a PWM signal input from a pulse width modulation circuit is high (H).

The LED array 18 is an example of a load driven by a predetermined current (a driving current $I_{LED}$), and is configured by serially connecting a plurality of LEDs $50_1$ to $50_n$ to one another (refer to FIG. 4). The semiconductor device 12 is a circuit that controls a current flowing through the LED array 18, and supplies the predetermined current (the driving current $I_{LED}$) to the LED array 18 in the case of turning on (driving) the LEDs $50_1$ to $50_n$ of the LED array 18. The constant voltage circuit 14 supplies the semiconductor device 12 with a constant voltage (a reference voltage $V_R$) larger than 0 V. The pulse width modulation circuit 16 receives luminance adjustment information (for example, information indicating the luminance of an image displayed on a liquid crystal display or peripheral brightness of the liquid crystal display) for adjusting the luminance of the LED array 18 from an external apparatus.

The pulse width modulation circuit 16 changes and modulates a duty ratio of a pulse signal (hereinafter, referred to as a PWM signal) in response to the received luminance adjustment information, and supplies the modulated PWM signal to the semiconductor device 12. For example, the pulse width modulation circuit 16 generates a PWM signal based on the luminance adjustment information to supply the semiconductor device 12 with the PWM signal such that the backlight (the LEDs $50_1$ to $50_n$) is dark when it is dark around the liquid crystal display and the backlight is bright when it is bright around the liquid crystal display. Furthermore, for example, the pulse width modulation circuit 16 generates a PWM signal based on the luminance adjustment information to supply the semiconductor device 12 with the PWM signal such that the backlight is bright when the luminance of an image displayed on the liquid crystal display is high (the image is bright) and the backlight is dark when the luminance is low (the image is dark). In addition, as the luminance of an image, average luminance of luminance of each pixel may be used.

Figure 5:
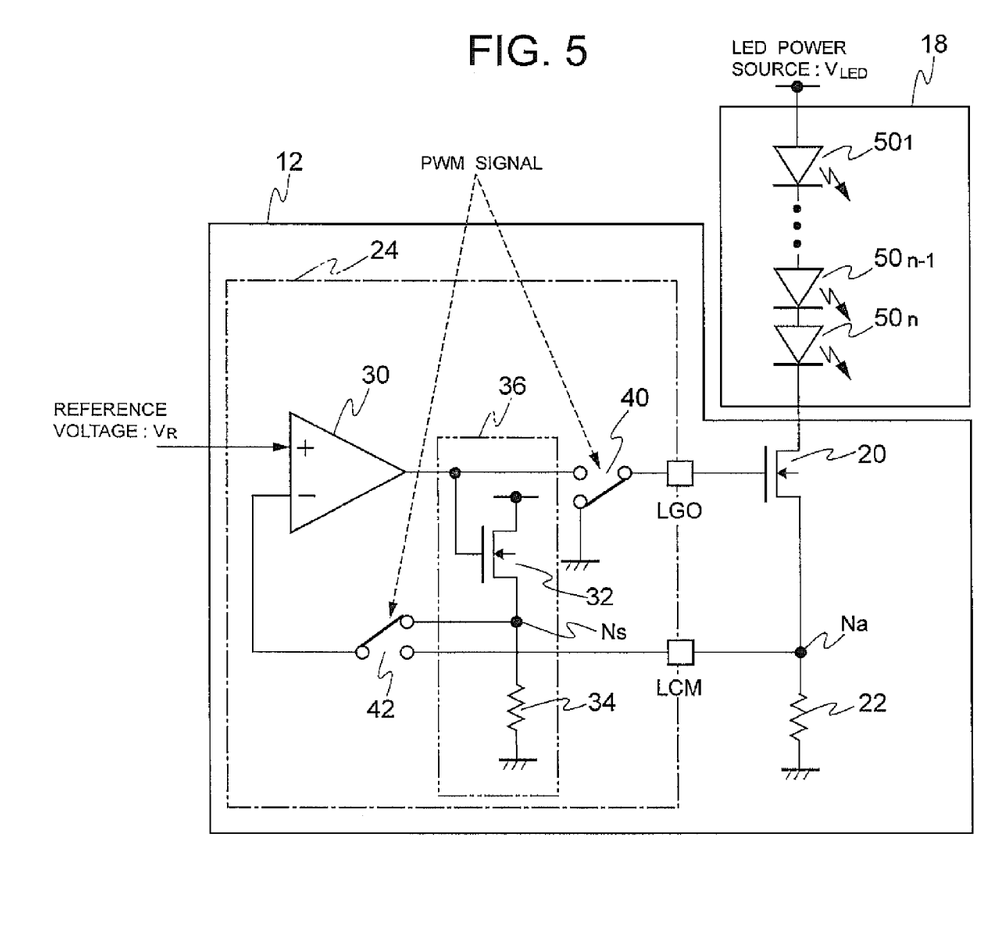
FIG. 5 is a diagram illustrating the LED driving apparatus according to the first embodiment, which illustrates a state of the LED driving apparatus when a PWM signal input from a pulse width modulation circuit is low (L).

FIG. 4 and FIG. 5 illustrate the configuration of the LED driving apparatus 11. FIG. 4 illustrates a circuit state when the PWM signal input from the pulse width modulation circuit 16 is high (H), and FIG. 5 illustrates a circuit state when the PWM signal input from the pulse width modulation circuit 16 is low (L).

The semiconductor device 12 includes an N channel MOSFET 20 and a resistor 22. The MOSFET 20 is an example of an active element capable of being turned on when a predetermined voltage is input from an operational amplifier 30 to be described later, and allowing the predetermined current (the driving current $I_{LED}$) to flow through the LED array 18, and the resistor 22 is an example of a load capable of generating a voltage corresponding to the driving current $I_{LED}$ and a resistance value through the flowing of the driving current $I_{LED}$. The MOSFET 20 has a gate terminal as a control input terminal, and has a drain terminal and a source terminal as a current output terminal. The LED array 18, the MOSFET 20, and the resistor 22 are serially connected to one another, resulting in the formation of a serial circuit.

In more detail, the drain terminal of the MOSFET 20 is connected to an end portion of a cathode terminal side of the LED array 18, and an end portion of an anode terminal side of the LED array 18 is connected to a power source $V_{LED}$. The source terminal of the MOSFET 20 is connected to one end of the resistor 22, and the other end of the resistor 22 is connected to the ground. The gate terminal of the MOSFET 20 is connected to a connection terminal LGO, and a node Na between the source terminal of the MOSFET 20 and the resistor 22 is connected to a connection terminal LCM.

In this semiconductor device 12, the MOSFET 20 is turned on, so that the driving current $I_{LED}$ flows through the LEDs $50_1$ to $50_n$ connected to the drain terminal of the MOSFET 20 and the resistor 22 connected to the source terminal thereof, and thus the LEDs $50_1$ to $50_n$ are turned on.

The semiconductor device 12 further includes a semiconductor circuit 24 capable of turning on/off the MOSFET 20 to control the driving of the LED array 18. The semiconductor circuit 24 includes the operational amplifier (OP AMP) 30, a voltage drop circuit 36, a switch 40, and a switch 42. The switch 40 and the switch 42 are controlled by the PWM signal that is input from the pulse width modulation circuit 16. In addition, as the switch 40 and the switch 42, a general semiconductor switch may be used.

The operational amplifier 30 has an inverting input terminal, a non-inverting input terminal, and an output terminal. The constant voltage (the reference voltage $V_R$) is supplied to the non-inverting input terminal of the operational amplifier 30 from the constant voltage circuit 14. The operational amplifier 30 outputs a voltage from the output terminal such that a voltage input to the inverting input terminal approximates to the reference voltage input to the non-inverting input terminal.

The switch 40 and the gate terminal of the MOSFET 20 are connected to each other through the connection terminal LGO. When the PWM signal is high (H), the switch 40 enters a first state of connecting the gate terminal of the MOSFET 20 to the output terminal of the operational amplifier 30 (refer to FIG. 4). Furthermore, when the PWM signal is low (L), the switch 40 enters a second state of connecting the gate terminal of the MOSFET 20 to the ground (refer to FIG. 5). In addition, although not illustrated in the drawings, for example, for current restriction, a resistor may be provided between the switch 40 and the gate terminal.

The voltage drop circuit 36 is provided between the output terminal of the operational amplifier 30 and the inverting input terminal of the operational amplifier 30. The voltage drop circuit 36 includes a MOSFET 32 and a resistor 34. The MOSFET 32 has a drain terminal connected to a power supply voltage VDD, a gate terminal connected to the output terminal of the operational amplifier 30, and a source terminal connected to one end of the resistor 34, and the other end of the resistor 34 is connected to the ground.

The inverting input terminal of the operational amplifier 30 is provided with the switch 42. When the PWM signal is high (H), the switch 42 enters a first state of connecting the inverting input terminal of the operational amplifier 30 to the node Na between the source terminal of the MOSFET 20 and the resistor 22 (refer to FIG. 4). Furthermore, when the PWM signal is low (L), the switch 42 enters a second state of connecting the inverting input terminal of the operational amplifier 30 to a node Ns between the source terminal of the MOSFET 32 of the voltage drop circuit 36 and the resistor 34 (refer to FIG. 5).

The voltage drop circuit 36, in which the node Ns is connected to the inverting input terminal of the operational amplifier 30 when the PWM signal is low (L), is a circuit capable of dropping the voltage output from the output terminal of the operational amplifier 30.

Even in an interval in which the PWM signal is low (L), a potential difference between the output terminal and the inverting input terminal of the operational amplifier 30 is generated by the voltage drop circuit 36, so that the output voltage of the operational amplifier 30 maintains a level approximate to (in the present embodiment, a level substantially equal to) the level of the output voltage when the PWM signal is high (H). That is, by the voltage drop circuit 36, a change in the voltage of each terminal of the operational amplifier 30 at the time of switching L/H of the PWM signal is small as compared with the case in which the voltage drop circuit 36 is not provided. Detailed operations of the voltage drop circuit 36 will be described later.

FIGS. 6A to 6F are diagrams illustrating examples of voltage and current waveforms of each terminal of the semiconductor device 12 illustrated in FIG. 4 and FIG. 5. Hereinafter, the following conditions are assumed. However, the conditions are examples, and the present invention is not limited thereto.

Reference voltage $V_R$: 0.4 V

Driving current $I_{LED}$ when LEDs $50_1$ to $50_n$ are turned on (driven): 20 mA Gate-source voltage $V_{gs1}$ when MOSFET 32 is turned on and allows driving current $I_{LED}$ to flow: 2.1 V Resistance value of resistor 22: 2Ω

Current flowing through voltage drop circuit 36 when MOSFET 32 is turned on: 20 µA Gate-source voltage $V_{gs2}$ when MOSFET 32 is turned on and thus current flows through voltage drop circuit 36: 2.0 V Resistance value of resistor 34: 2 kΩ

Voltage drop (a potential difference) occurring due to the voltage drop circuit 36 is $V_{gs2}$. In addition, in the present embodiment, the semiconductor device 12 is configured such that the difference between $V_{gs1}$ and $V_{gs2}$ is smaller than a predetermined value. It is preferable that the difference between $V_{gs1}$ and $V_{gs2}$ approximates to 0. Hereinafter, a description will be provided for an example in which the difference between $V_{gs1}$ and $V_{gs2}$ is 0.1 V.

When the PWM signal is switched from low (L) to high (H) (refer to FIG. 6A), the switch 40 enters the first state, so that the output terminal of the operational amplifier 30 is connected to the gate terminal of the MOSFET 20 as shown in FIG. 4. Furthermore, since the switch 42 enters the first state, the inverting input terminal of the operational amplifier 30 is connected to the node Na. Furthermore, the reference voltage $V_R$ (0.4 V) is continuously supplied to the non-inverting input terminal of the operational amplifier 30 (refer to FIG. 6B). The operational amplifier 30 increases the voltage $V_O$, which is output from the output terminal thereof, to 2.5 V ($V_R+V_{gs1}$) such that the voltage of the inverting input terminal is 0.4 V (refer to FIG. 6C). A voltage for turning on the MOSFET 32 is applied from the output terminal of the operational amplifier 30 to the gate terminal of the MOSFET 32 (refer to FIG. 6D), so that a current of 20 mA flows through the LED array 18 and the resistor 22 (refer to FIG. 6F), a voltage input to the inverting input terminal of the operational amplifier 30 is 0.4 V (refer to FIG. 6E), and thus the LEDs $50_1$ to $50_n$ are turned on.

Figure 6A:
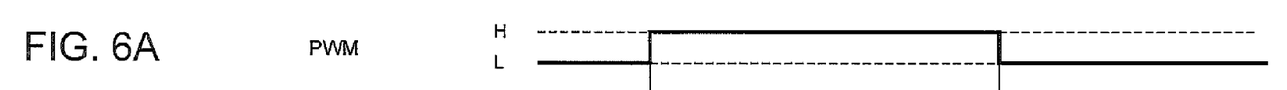
FIGS. 6A to 6F are diagrams illustrating examples of voltage and current waveforms of each terminal of the constant current circuit according to the first embodiment.
Figures 6B, 6C:
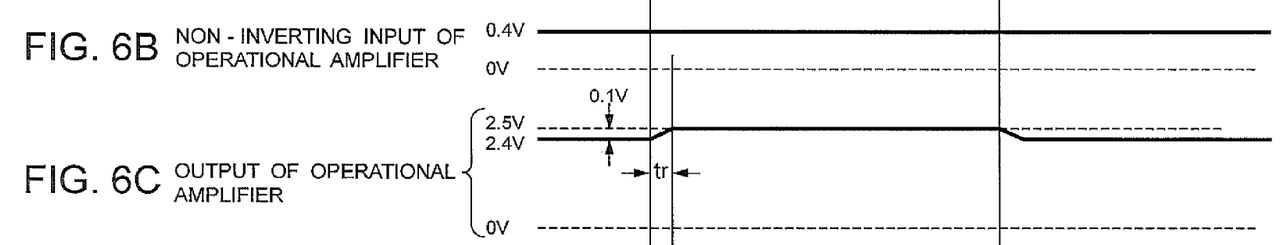
Figure 6D:
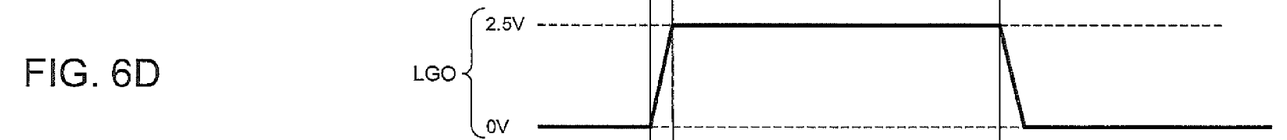
Figure 6E:
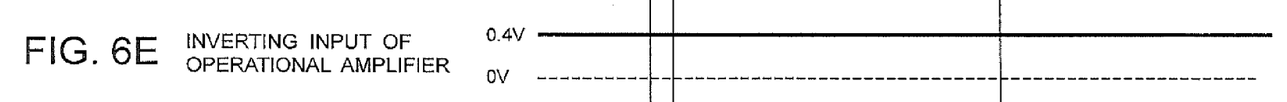
Figure 6F:
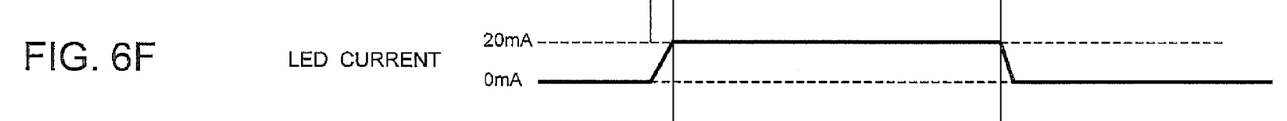

When the PWM signal is switched from high (H) to low (L) (refer to FIG. 6A), the switch 40 enters the second state, so that the output terminal of the operational amplifier 30 is disconnected to the gate terminal of the MOSFET 20 as illustrated in FIG. 5 (refer to FIG. 6D). Since the gate terminal of the MOSFET 20 is connected to the ground, the MOSFET 20 is turned off, and the current flowing through the LED array 18 and the resistor 22 becomes approximately 0 mA (refer to FIG. 6F), each of the LEDs $50_1$ to $50_n$ of the LED array 18 is turned off.

Meanwhile, even in the interval in which the PWM signal is low (L), since the constant voltage output operation of the constant voltage circuit 14 is continued, the reference voltage $V_R$ is continuously supplied to the non-inverting input terminal of the operational amplifier 30 (refer to FIG. 6B). Furthermore, since the switch 42 enters the second state, the inverting input terminal of the operational amplifier 30 is connected to a voltage output part (the node Ns) of the voltage drop circuit 36. A voltage for turning on the MOSFET 32 is applied from the output terminal of the operational amplifier 30 to the gate terminal of the MOSFET 32, so that a current of 20 µA flows through the voltage drop circuit 36, voltage drop occurs, and thus a voltage corresponding to the reference voltage $V_R$ is generated at the node Ns between the MOSFET 32 and the resistor 34. Consequently, the voltage of 0.4 V corresponding to the reference voltage $V_R$ is continuously input to the inverting input terminal of the operational amplifier 30 connected to the node Ns (refer to FIG. 6E). The output voltage of the operational amplifier 30 is a voltage $V_R+V_{gs2}$ (2.4 V) obtained by adding the gate-source voltage $V_{gs2}$ to the reference voltage $V_R$ (refer to FIG. 6C).

As described above, even in the interval in which the PWM signal is low (L), the voltage drop circuit 36 is provided to generate the potential difference (the voltage drop) between the output terminal and the inverting input terminal of the operational amplifier 30, so that there is no large difference between the output voltage in the interval in which the PWM signal is high (H) and the output voltage in the interval in which the PWM signal is low (L). Consequently, as illustrated in FIG. 6C, it is possible to shorten the time period tr until the operational amplifier 30 reaches a steady state after the PWM signal is switched from low (L) to high (H).

This effect will be further described in detail. In the conventional configuration, as illustrated in FIG. 2C, when the PWM signal is switched from low (L) to high (H), a time period is required until the output voltage of the operational amplifier 30 changes from 0 V to $V_R+V_{gs1}$ (2.5 V in the above example).

Meanwhile, in the configuration of the embodiment, the output of the operational amplifier 30 corresponds to a variation $|V_{gs1}-V_{gs2}|$ (0.1 V in the above example) from $V_R+V_{gs1}$ to $V_R+V_{gs2}$. This variation is sufficiently small as compared with the conventional example.

Furthermore, for example, when $V_{gs1}$ is set to 2.1 V, $V_{gs2}$ is set to 2.0 V, and $\Delta V_O/\Delta V_1$ is set to 1 V/µs, since the time period tr until the operational amplifier 30 reaches the steady state after the switching of the PWM signal from L to H is 0.1 µs, the time period tr is significantly shortened as compared with the conventional example. That is, according to the present embodiment, when the MOSFET 20 is switched from OFF to ON, it is possible to shorten a time period until the driving current $I_{LED}$ (20 mA in the above example) starts to flow through the LED array 18 and the resistor 22 after the start of the switching, as compared with the conventional art.

As described above, according to the configuration, it is possible to shorten the time period required for a change in the output of the operational amplifier 30, and further to allow the entire semiconductor device 12 to operate at high speed.

Moreover, in the conventional constant current circuit, since it is necessary to configure the operational amplifier 106 such that 0 V is input to the non-inverting input terminal and the inverting input terminal, design or selection of the operational amplifier 106 is significantly limited. However, in the present embodiment, even in the interval in which the PWM signal is low (L), since an input voltage to the inverting input terminal and the non-inverting input terminal of the operational amplifier 30 is larger than 0 V, limitation of design or selection of the operational amplifier 30 is reduced as compared with the conventional art.

In addition, in the example, even in the interval in which the PWM signal is high (H), since the drain terminal of the MOSFET 32 maintains a connection to the output terminal of the operational amplifier 30, input capacitance of the MOSFET 32 serves as a load for the operational amplifier 30. However, in the interval in which the PWM signal is high (H), the voltage drop circuit 36 does not exists in a path for feedbacking a current or a voltage to the operational amplifier 30, and further allows load capacitance of the MOSFET 32 to be very smaller than load capacitance of the MOSFET 20 and allows the current (20 µA in the above example) flowing through the voltage drop circuit 36 to be small and ignorable as compared with the driving current $I_{LED}$ as described above, thereby having no significant influence on the entire operation of the semiconductor device 12. Furthermore, in the interval in which the PWM signal is high (H), a switch may be provided to electrically disconnect a connection between the voltage drop circuit 36 and the output terminal of the operational amplifier 30.

Furthermore, the example has a configuration in which the switch 40 is provided to the output terminal of the operational amplifier 30 and allows the gate-source voltage of the MOSFET 20 to be 0 V when the PWM signal is switched from high (H) to low (L). This configuration is preferable because in the interval in which the PWM signal is low (L), no current flows through the LEDs $50_1$ to $50_n$ so that the LEDs $50_1$ to $50_n$ can be apparently turned off. Meanwhile, in the interval in which the PWM signal is low (L), the voltage output from the operational amplifier 30 turns on the MOSFET 32. However, if the voltage output from the operational amplifier 30 has a level insufficient for turning on the MOSFET 20 (for example, $V_{gs2}+V_R$ is set to be lower than a threshold voltage of the MOSFET 20), it may be possible to provide a configuration in which the gate terminal of the MOSFET 20 is always connected to the output terminal of the operational amplifier 30, without providing the switch 40.

In addition, at the time of switching of the switch 40 and the switch 42, fluctuation may occur in the inverting input voltage of the operational amplifier 30. However, since the occurrence time is very short and it has no influence on the operation of the operational amplifier 30, it is not illustrated in FIG. 6E.

Furthermore, the embodiment has described an example in which the voltage drop circuit 36 is configured using the MOSFET 32 and the resistor 34. However, the present invention is not limited thereto.

Figure 7A:
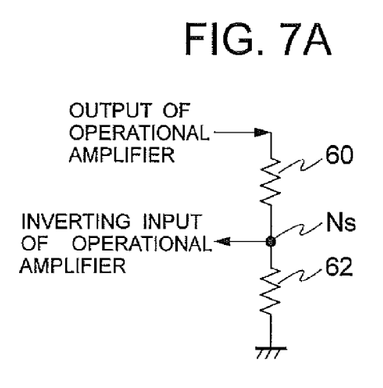
FIGS. 7A to 7D are diagrams illustrating modification examples of a voltage drop circuit.

For example, as illustrated in FIG. 7A, the voltage drop circuit may be configured by serially connecting two resistors 60 and 62 to each other. One end of the resistor 60 is connected to the output terminal of the operational amplifier 30 and the other end of the resistor 60 is connected to one end of the resistor 62. The other end of the resistor 62 is connected to the ground. A node Ns between the resistor 60 and the resistor 62 is connected to the inverting input terminal of the operational amplifier 30 through the switch 42.

According to this voltage drop circuit, voltage drop (a potential difference) occurs due to voltage division by the two resistors. When a resistance value of the resistor 60 is set to R1, a resistance value of the resistor 62 is set to R2, and the output voltage of the operational amplifier 30 is set to $V_{out}$, the potential difference ΔV may be expressed by the following Equation.

$$\Delta V = V_{out} * R1/(R1+R2)$$

Figure 7B:
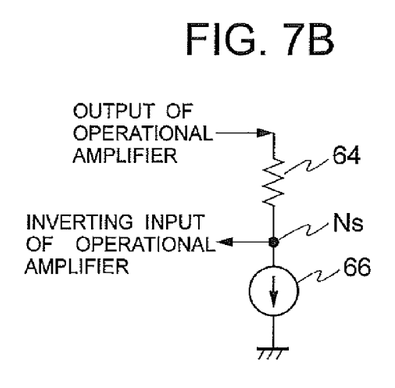

Furthermore, for example, as illustrated in FIG. 7B, the voltage drop circuit may be configured by serially connecting a resistor 64 and a constant current source 66 to each other. One end of the resistor 64 is connected to the output terminal of the operational amplifier 30 and the other end of the resistor 64 is connected to the constant current source 66. A node Ns between the resistor 64 and the constant current source 66 is connected to the inverting input terminal of the operational amplifier 30 through the switch 42.

According to this voltage drop circuit, a desired potential difference is generated by a current value generated by the constant current source 66 and a resistance value of the resistor 64. When the resistance value of the resistor 64 is set to R3 and the current value of the constant current source 66 is set to $I_O$, the potential difference ΔV may be expressed by the following Equation.

$$\Delta V = R3 * I_O$$

By the constant current source 66, it is possible to provide an approximately constant current, so that it is possible to generate an approximately constant potential difference (an approximately ideal potential difference) during an operation, and thus controllability is excellent as compared with the configuration of FIG. 7A.

Figure 7C:
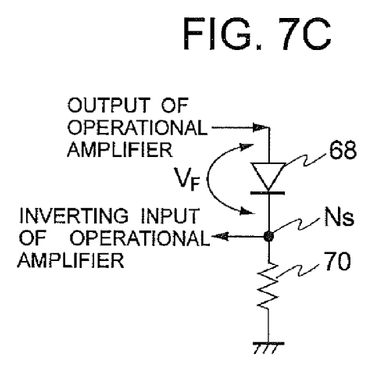

Furthermore, for example, as illustrated in FIG. 7C, the voltage drop circuit may be configured by serially connecting a diode 68 and a resistor 70 to each other. The anode of the diode 68 is connected to the output terminal of the operational amplifier 30 and the cathode of the diode 68 is connected to one end of the resistor 70. The other end of the resistor 70 is connected to the ground. A node Ns between the diode 68 and the resistor 70 is connected to the inverting input terminal of the operational amplifier 30 through the switch 42. In the case in which a forward voltage applied to the diode 68 when a current flows through the voltage drop circuit is set to $V_F$, the potential difference ΔV may be expressed by the following Equation.

$$\Delta V \approx V_F$$

In this voltage drop circuit, the potential difference ΔV is approximately equal to the forward voltage $V_F$ applied to the diode 68.

Figure 7D:
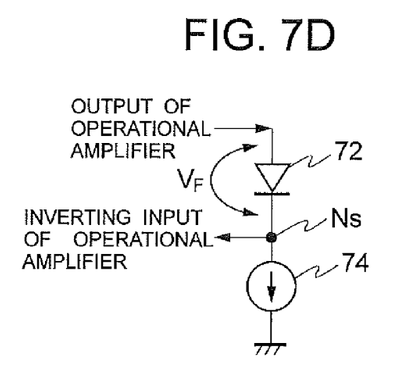

Furthermore, for example, as illustrated in FIG. 7D, the voltage drop circuit may be configured by serially connecting a diode 72 and a constant current source 74 to each other. The anode of the diode 72 is connected to the output terminal of the operational amplifier 30 and the cathode of the diode 72 is connected to the constant current source 74. A node Ns between the diode 72 and the constant current source 74 is connected to the inverting input terminal of the operational amplifier 30 through the switch 42.

According to this voltage drop circuit, by the constant current source 74, it is possible to provide an approximately constant current, so that it is possible to generate an approximately constant potential difference (an approximately ideal potential difference) during the operation, and thus controllability is excellent as compared with the configuration of FIG. 7C.

Figure 8A:
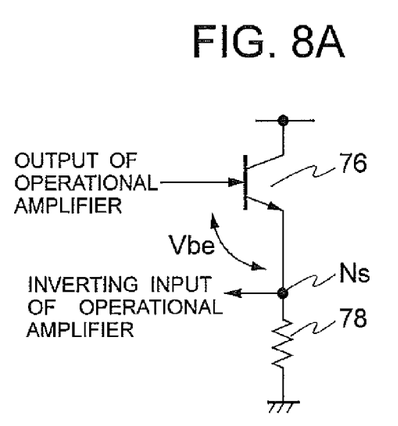
FIGS. 8A to 8C are diagrams illustrating further modification examples of the voltage drop circuit.

Furthermore, for example, as illustrated in FIG. 8A, the voltage drop circuit may be configured by serially connecting an N channel bipolar transistor 76 and a resistor 78 to each other. The collector terminal of the bipolar transistor 76 is connected to a power supply voltage VDD, the base terminal of the bipolar transistor 76 is connected to the output terminal of the operational amplifier 30, and the emitter terminal of the bipolar transistor 76 is connected to one end of the resistor 78. The other end of the resistor 78 is connected to the ground. A node Ns between the bipolar transistor 76 and the resistor 78 is connected to the inverting input terminal of the operational amplifier 30 through the switch 42. In the case in which a base-emitter voltage when the bipolar transistor 76 is turned on and allows a current to flow through the voltage drop circuit is set to $V_{be}$, the potential difference ΔV may be expressed by the following Equation.

$$\Delta V \approx V_{be}$$

In this voltage drop circuit, the potential difference ΔV is approximately equal to the base-emitter voltage $V_{be}$ of the bipolar transistor 76.

Figure 8B:
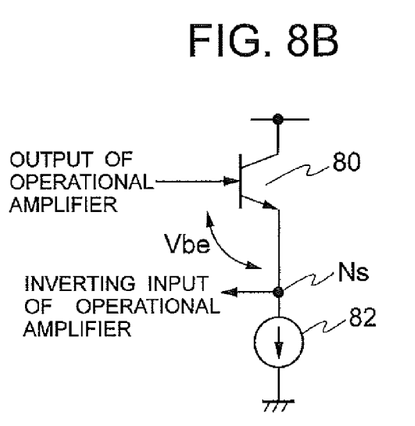

Furthermore, for example, as illustrated in FIG. 8B, the voltage drop circuit may be configured by serially connecting an N channel bipolar transistor 80 and a constant current source 82 to each other. The collector terminal of the bipolar transistor 80 is connected to a power supply voltage VDD, the base terminal of the bipolar transistor 80 is connected to the output terminal of the operational amplifier 30, and the emitter terminal of the bipolar transistor 80 is connected to the constant current source 82. A node Ns between the bipolar transistor 80 and the constant current source 82 is connected to the inverting input terminal of the operational amplifier 30 through the switch 42.

According to this voltage drop circuit, by the constant current source 82, it is possible to provide an approximately constant current, so that it is possible to generate an approximately constant potential difference (an approximately ideal potential difference) during an operation, and thus controllability is excellent as compared with the configuration of FIG. 8A.

Figure 8C:
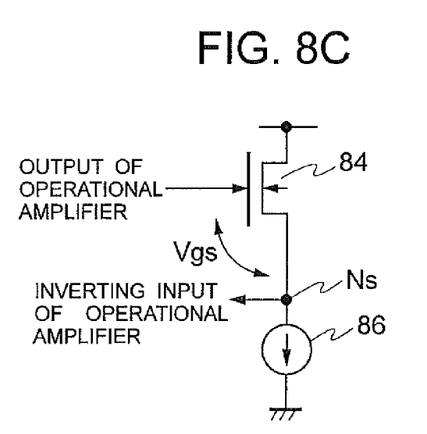

Furthermore, for example, as illustrated in FIG. 8C, the voltage drop circuit may be configured by serially connecting an N channel MOSFET 84 and a constant current source 86 to each other. The drain terminal of the MOSFET 84 is connected to a power supply voltage VDD, the gate terminal of the MOSFET 84 is connected to the output terminal of the operational amplifier 30, and the source terminal of the MOSFET 84 is connected to the constant current source 86. A node Ns between the MOSFET 84 and the constant current source 86 is connected to the inverting input terminal of the operational amplifier 30 through the switch 42.

In the case in which a gate-source voltage when the MOSFET 84 is turned on and allows a current to flow through the voltage drop circuit is set to $V_{gs}$, the potential difference ΔV may be expressed by the following Equation.

$$\Delta V \approx V_{gs}$$

According to this voltage drop circuit, by the constant current source 86, it is possible to provide an approximately constant current, so that it is possible to generate an approximately constant potential difference (an approximately ideal potential difference) during an operation, and thus controllability is excellent as compared with the configuration of the voltage drop circuit 36 illustrated in FIG. 4 and FIG. 5.

It is preferable that the potential difference generated by each voltage drop circuit as described above approximates to $V_{gs1}$. However, if the difference between the potential difference and $V_{gs1}$ of the MOSFET 20 is smaller than a predetermined value (is larger than 0 V and smaller than $V_{gs1}$), it is possible to shorten the time period tr as compared with the conventional example.

Of course, in accordance with the gate-source voltage $V_{gs1}$ of the MOSFET 20, multiple connections of one of the aforementioned voltage drop circuits may be used as one voltage drop circuit, or a combination of the various types of voltage drop circuits may be used as one voltage drop circuit.

So far, among the devices constituting the semiconductor device 12, the MOSFET 20 has been described as an example of an active element that is connected to an end portion of the cathode side of the LED array 18 and supplies a predetermined current to the LED array 18 when the active element is turned on. However, the active element is not limited thereto. For example, it is of course that a JFET (junction FET) or a bipolar transistor may be used as the active element.

[Second Embodiment]

Next, an LED driving system of a second embodiment will be described. Since the LED driving system of the second embodiment has substantially the same configuration as the configuration illustrated in FIG. 3, except for the configuration of the constant current circuit included in the LED driving system of the first embodiment, the LED driving system of the second embodiment is not illustrated and a constant current circuit 13 according to the second embodiment will be described in detail.

Figure 9:
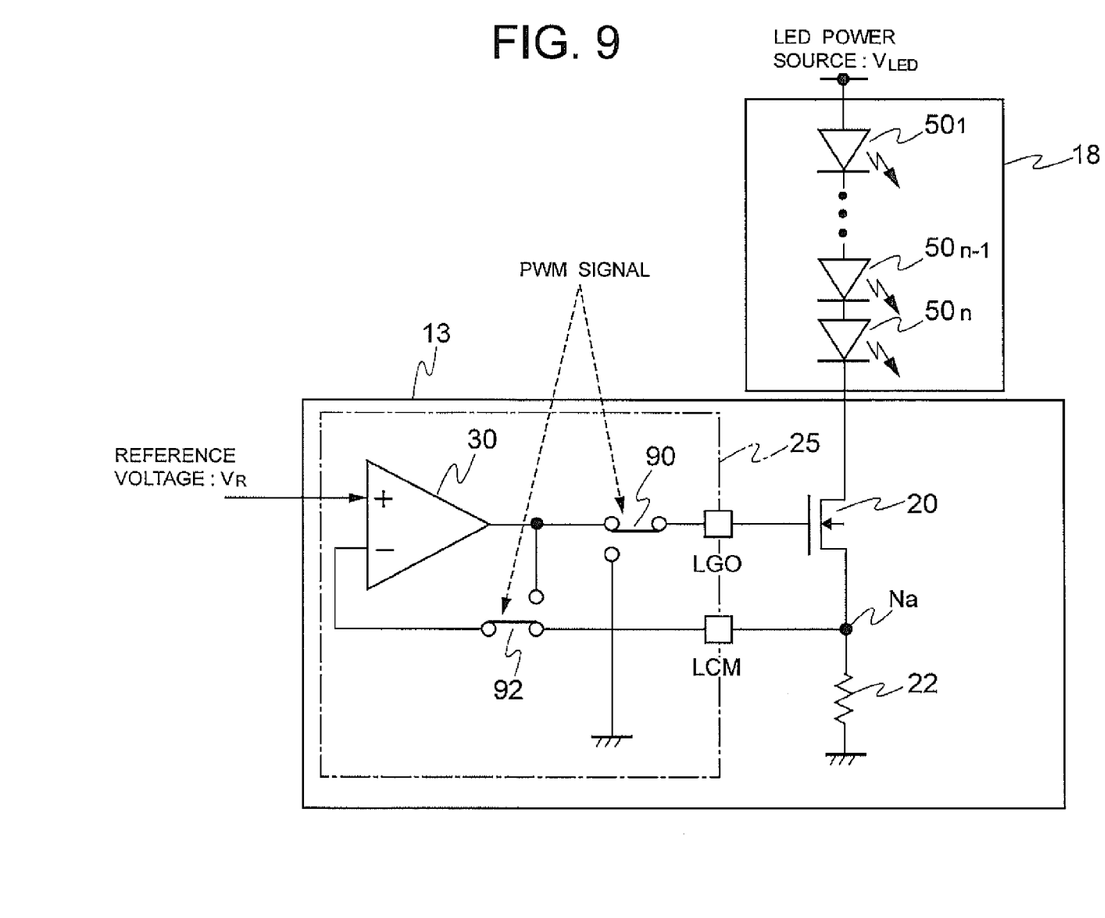
FIG. 9 is a diagram illustrating an LED driving apparatus according to a second embodiment, which illustrates a state of the LED driving apparatus when a PWM signal input from a pulse width modulation circuit is high (H).
Figure 10:
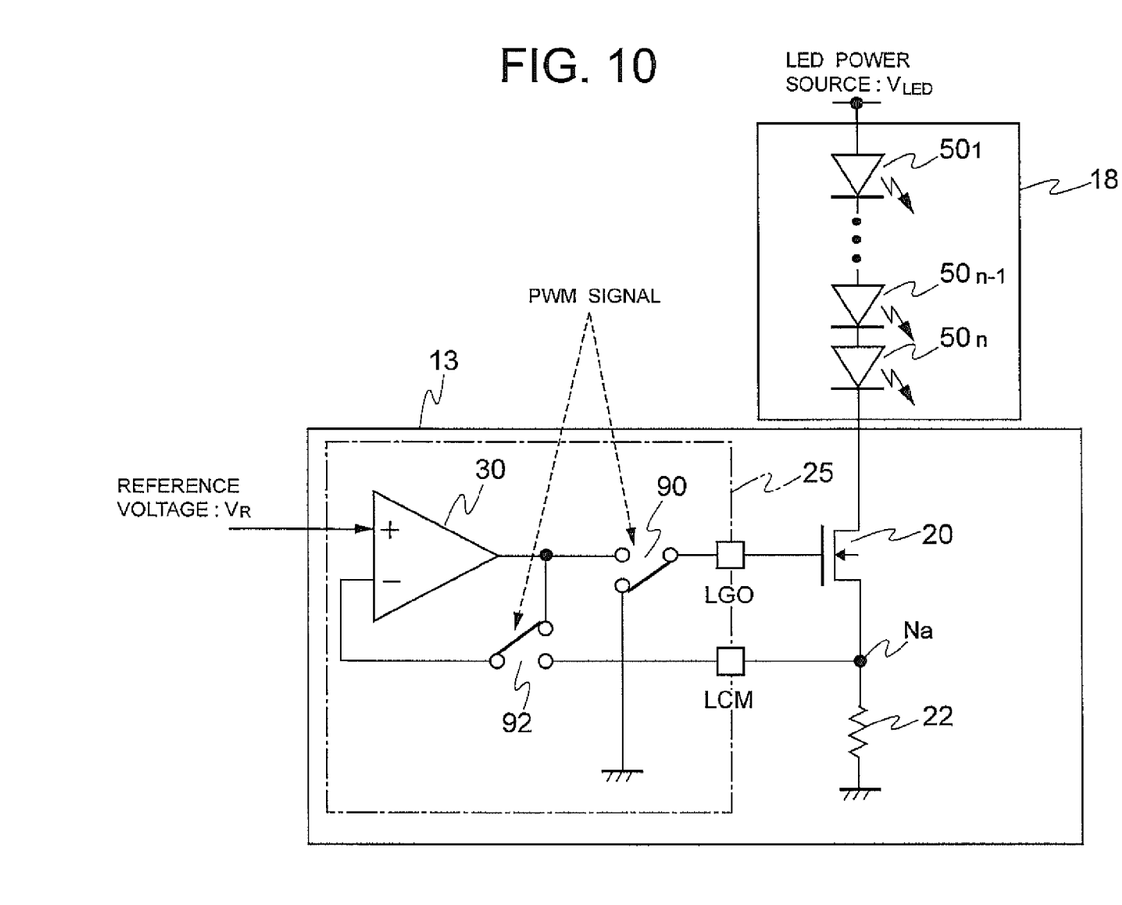
FIG. 10 is a diagram illustrating the LED driving apparatus according to the second embodiment, which illustrates a state of the LED driving apparatus when a PWM signal input from a pulse width modulation circuit is low (L).

FIG. 9 and FIG. 10 illustrate the configuration of an LED driving apparatus including the semiconductor device 13 according to the second embodiment. FIG. 9 illustrates a circuit state when a PWM signal input from a pulse width modulation circuit 16 is high (H) and FIG. 10 illustrates a circuit state when the PWM signal input from the pulse width modulation circuit 16 is low (L).

Hereinafter, in FIG. 9 and FIG. 10, the same reference numerals are used to designate to the same or equivalent parts as those of FIG. 4 and FIG. 5, and a description thereof will be omitted.

The semiconductor device 13 includes a semiconductor circuit 25 that controls a MOSFET 20. The semiconductor circuit 25 includes an operational amplifier 30, a switch 90, and a switch 92. The switch 90 and the switch 92 are controlled by the PWM signal that is input from the pulse width modulation circuit 16. In addition, as the switch 90 and the switch 92, a general semiconductor switch may be used.

The switch 90 and a gate terminal of the MOSFET 20 are connected to each other through a connection terminal LGO. When the PWM signal is high (H), the switch 90 enters a first state of connecting the gate terminal of the MOSFET 20 to an output terminal of the operational amplifier 30 (refer to FIG. 9). Furthermore, when the PWM signal is low (L), the switch 90 enters a second state of connecting the gate terminal of the MOSFET 20 to the ground (refer to FIG. 10). In addition, although not illustrated in the drawings, for example, for current restriction, a resistor may be provided between the switch 90 and the gate terminal.

A reference voltage $V_R$ is supplied to a non-inverting input terminal of the operational amplifier 30 from a constant voltage circuit 14. The operational amplifier 30 is provided with an inverting input terminal thereof with the switch 92. When the PWM signal is high (H), the switch 92 enters a first state of connecting the inverting input terminal of the operational amplifier 30 to a node Na between a source terminal of the MOSFET 20 and a resistor 22 (refer to FIG. 9). Furthermore, when the PWM signal is low (L), the switch 92 enters a second state of connecting the inverting input terminal of the operational amplifier 30 to the output terminal of the operational amplifier 30 (refer to FIG. 10).

FIGS. 11A to 11F are diagrams illustrating examples of voltage and current waveforms of each terminal of the semiconductor device 13 illustrated in FIG. 9 and FIG. 10. Hereinafter, the followings conditions are assumed. However, the conditions are an example, and the present invention is not limited thererto.

Reference voltage $V_R$: 0.4 V

Driving current $I_{LED}$ when LEDs $50_1$ to $50_n$ are turned on (driven): 20 mA Gate-source voltage $V_{gs1}$ when MOSFET 20 is turned on and allows driving current $I_{LED}$ to flow: 2.1 V Resistance value of resistor 22: 2Ω

When the PWM signal is switched from low (L) to high (H) (refer to FIG. 11A), the switch 90 enters the first state, so that the output terminal of the operational amplifier 30 is connected to the gate terminal of the MOSFET 20 as illustrated in FIG. 9. Furthermore, since the switch 92 enters the first state, the inverting input terminal of the operational amplifier 30 is connected to the node Na. Furthermore, the reference voltage $V_R$ (0.4 V) is continuously supplied to the non-inverting input terminal of the operational amplifier 30 (refer to FIG. 11B). The operational amplifier 30 increases a voltage $V_O$, which is output from the output terminal thereof, to 2.5 v ($V_R+V_{gs1}$) such that the voltage of the inverting input terminal is 0.4 V (refer to FIG. 11C). A voltage for turning on the MOSFET 20 is applied from the output terminal of the operational amplifier 30 to the gate terminal of the MOSFET 20 (refer to FIG. 11D), so that a current of 20 mA flows through an LED array 18 (refer to FIG. 11F), a voltage input to the inverting input terminal of the operational amplifier 30 is 0.4 V (refer to FIG. 11E), and thus the LEDs $50_1$ to $50_n$ are turned on.

Figure 11A:
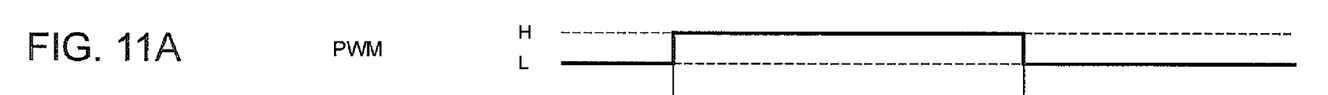
FIGS. 11A to 11F are diagrams illustrating examples of voltage and current waveforms of each terminal of a constant current circuit according to the second embodiment.
Figure 11B:
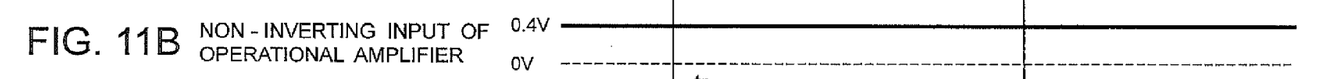
Figure 11C:
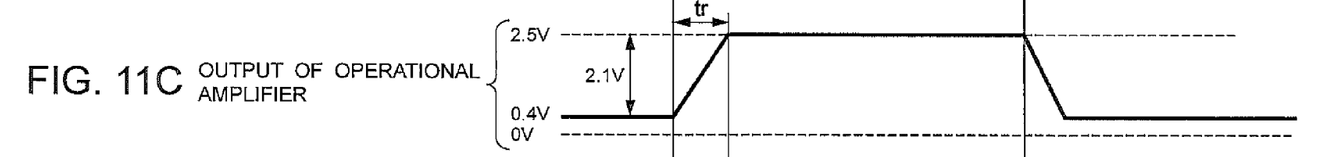
Figure 11D:
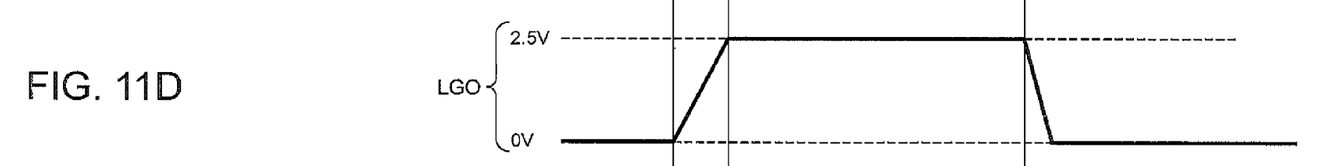
Figure 11E:
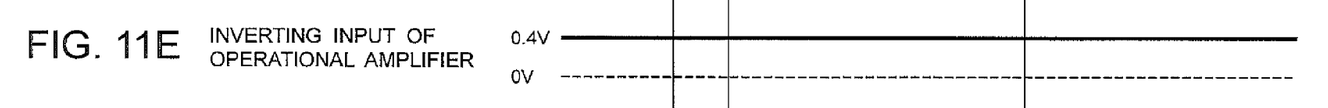
Figure 11F:
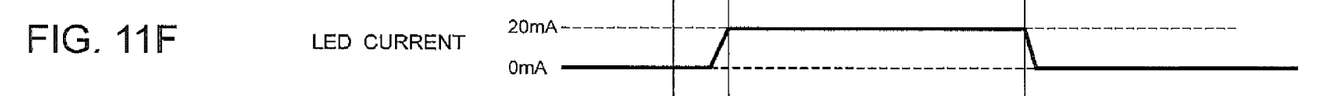

When the PWM signal is switched from high (H) to low (L) (refer to FIG. 11A), the switch 90 enters the second state, so that the output terminal of the operational amplifier 30 is disconnected to the gate terminal of the MOSFET 20 as illustrated in FIG. 10 (refer to FIG. 11D). Since the gate terminal of the MOSFET 20 is connected to the ground, the MOSFET 20 is turned off, and the LED current is approximately 0 mA (refer to FIG. 11F), each of the LEDs $50_1$ to $50_n$ of the LED array 18 is turned off.

Meanwhile, even in the interval in which the PWM signal is low (L), since the constant voltage output operation of a constant voltage circuit 14 is continued, the reference voltage $V_R$ (0.4 V) is continuously supplied to the non-inverting input terminal of the operational amplifier 30 (refer to FIG. 11B). Furthermore, since the switch 92 enters the second state, the inverting input terminal of the operational amplifier 30 is connected to the output terminal of the operational amplifier 30. In this way, the operational amplifier 30 has a configuration of an amplifier (a voltage follower) of gain 1, so that the voltage output from the output terminal of the operational amplifier 30 and the voltage input to the inverting input terminal of the operational amplifier 30 are 0.4 V (refer to FIG. 11C and FIG. 11F).

As described above, even in the interval in which the PWM signal is low (L), the reference voltage $V_R$ is input to the non-inverting input terminal of the operational amplifier 30 and a voltage corresponding to the reference voltage $V_R$ is input to the inverting input terminal thereof. Consequently, it is not necessary to configure the operational amplifier 30 such that 0 V is input, so that limitation of design or selection of the operational amplifier 30 is reduced. The input voltage to each terminal is not significantly changed as compared with the conventional example, so that the operation of the operational amplifier 30 is stabilized. Moreover, the output voltage of the operational amplifier 30 is changed from $V_R$ (0.4 V) to $V_R+V_{sg1}$ (2.5 V), so that it is possible to shorten the time period tr required for the change (refer to FIG. 11C), as compared with the conventional example (refer to FIG. 1 and FIG. 2C) in which the output voltage is changed from 0 V to $V_R+V_{sg1}$ (2.5 V). That is, according to the present embodiment, when the MOSFET 20 is switched from OFF to ON, it is possible to shorten a time period until the driving current $I_{LED}$ (20 mA in the above example) starts to flow through the LED array 18 and a resistor 22 after the start of the switching, as compared with the related art.

So far, among the devices constituting the semiconductor device 13, the MOSFET 20 has been described as an example of an active element that is connected to an end portion of the cathode side of the LED array 18 and supplies a predetermined current to the LED array 18 when the active element is turned on. However, the active element is not limited thereto. For example, it is of course that a JFET (junction FET) or a bipolar transistor may be used as the active element.

Furthermore, the first embodiment and the second embodiment have been explained by describing examples of the semiconductor device for supplying a predetermined current to the LED array. However, a load driven by the predetermined current is not limited to the LED. For example, various light emitting elements such as organic ELs may be used as the load. Furthermore, the above example may be applied to a device for supplying a predetermined current to a light emitting element such as an LED or an organic EL, which is used in an illumination device, instead of an LED serving as a backlight of a liquid crystal display.

This application is based on Japanese Patent Application No. 2012-096552 which is herein incorporated by reference.

What is claimed is:

1. A semiconductor circuit that controls driving of a first load, the semiconductor circuit comprising:
   an operational amplifier that includes a first input terminal, a second input terminal, and an output terminal, and that outputs a first voltage from the output terminal;
   a voltage drop circuit which drops the first voltage and generates a second voltage; and
   an input switching part configured to input a third voltage to the second input terminal during a first interval in which an active element is turned on by the first voltage, and to input the second voltage to the second input terminal during a second interval in which the active element is turned off.

2. The semiconductor circuit of claim 1, wherein the active element is turned on in response to a predetermined input voltage and allows a predetermined current for driving the first load to flow.

3. The semiconductor circuit of claim 1, wherein the operational amplifier outputs the first voltage from the output terminal such that a voltage input to the second input terminal approximates a voltage input to the first input terminal.

4. The semiconductor circuit of claim 1, wherein the third voltage corresponds to a voltage at the active element that is responsive to a predetermined current flowing when the active element is turned on.

5. The semiconductor circuit of claim 1, wherein the active element includes a control terminal, a first terminal connected to the first load, and a second terminal connected to a second load, and is configured such that a difference between a voltage dropped by the voltage drop circuit and a voltage between the control terminal and the second terminal is smaller than a predetermined value when the active element is turned on and allows a predetermined current to be output to the first load and the second load.

6. The semiconductor circuit of claim 5, wherein the first load includes a light emitting element.

7. The semiconductor circuit of claim 1, wherein the first load includes a light emitting element.

8. A semiconductor device comprising:
- an active element electrically connected to a first load, the active element turned on in response to a predetermined input voltage and allowing a predetermined current for driving the first load to flow;
- a second load electrically connected to the active element and generating a first voltage when the predetermined current flows through the second load;
- an operational amplifier that includes a first input terminal for receiving a reference voltage, a second input terminal, and an output terminal, and that outputs a second voltage from the output terminal such that a voltage input to the second input terminal approximates the reference voltage input to the first input terminal;
- a voltage drop circuit which drops the second voltage, which is output from the output terminal of the operational amplifier, and generates a third voltage; and
- an input switching part configured to input the first voltage to be input to the second input terminal of the operational amplifier during a first interval in which the active element is turned on by the second voltage output from the output terminal of the operational amplifier, and to input the third voltage to the second input terminal in a second interval during which the active element is turned off.

* * * * *